(12) United States Patent
Kim et al.

(10) Patent No.: US 9,612,528 B2
(45) Date of Patent: Apr. 4, 2017

(54) METHODS OF MANUFACTURING PELLICLES HAVING GRAPHITE LAYERS

(71) Applicant: SAMSUNG ELECTRONICS CO., LTD., Suwon-si, Gyeonggi-do (KR)

(72) Inventors: Munja Kim, Suwon-si (KR); Byunggook Kim, Seoul (KR); Jaehyuck Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 103 days.

(21) Appl. No.: 14/736,706

(22) Filed: Jun. 11, 2015

(65) Prior Publication Data
US 2016/0139500 A1    May 19, 2016

(30) Foreign Application Priority Data

Nov. 13, 2014    (KR) .......................... 10-2014-0158190

(51) Int. Cl.
*G03F 1/62*    (2012.01)
*G03F 1/64*    (2012.01)

(52) U.S. Cl.
CPC . *G03F 1/62* (2013.01); *G03F 1/64* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | |
|---|---|---|
| 4,970,099 A | 11/1990 | Adams et al. |
| 5,168,001 A | 12/1992 | Legare et al. |
| 6,623,893 B1 | 9/2003 | Levinson et al. |
| 7,767,985 B2 | 8/2010 | Okoroanyanwu et al. |
| 2005/0042524 A1 | 2/2005 | Bellman |
| 2010/0124709 A1 | 5/2010 | Hawtof et al. |
| 2011/0116068 A1 | 5/2011 | Wilklow et al. |
| 2013/0004711 A1 | 1/2013 | Doi et al. |
| 2013/0088699 A1 | 4/2013 | Yakunin et al. |
| 2014/0160455 A1 | 6/2014 | Yakunin et al. |

FOREIGN PATENT DOCUMENTS

| | | |
|---|---|---|
| JP | 2013-195950 A | 9/2013 |
| KR | 10-2008-0001446 A | 1/2008 |
| KR | 10-2013-0088565 A | 8/2013 |

*Primary Examiner* — Christopher Young
(74) *Attorney, Agent, or Firm* — Lee & Morse P.C.

(57) ABSTRACT

Provided is a method of manufacturing a pellicle. The method includes preparing a substrate, forming a membrane on the substrate by performing a chemical vapor deposition (CVD) process, separating the membrane from the substrate in a first solvent, rinsing the separated membrane in a second solvent, and transferring the separated membrane to a frame in a third solvent.

20 Claims, 10 Drawing Sheets

METHODS OF MANUFACTURING PELLICLES HAVING GRAPHITE LAYERS

CROSS-REFERENCE TO RELATED APPLICATION

Korean Patent Application No. 10-2014-0158190, filed on Nov. 13, 2014, in the Korean Intellectual Property Office, and entitled: "Methods Of Manufacturing Pellicles Having Graphite Layers," is incorporated by reference herein in its entirety.

BACKGROUND

1. Field

Embodiments relate to pellicles including a membrane having a graphite layer and methods of fabricating the pellicles.

2. Description of the Related Art

A photolithography process using extreme ultraviolet (EUV) light uses a reflective reticle. A pellicle is needed to protect a pattern of the reflective reticle from physical and chemical attacks. However, a pellicle which is suitable for the reflective reticle has not been currently suggested. A membrane of a pellicle which is used in a conventional transmissive photolithography process, which uses deep ultraviolet (DUV) light, has a low transmittance of EUV light, and thus durability is poor and productivity is reduced. Thus, a pellicle having a membrane, of which durability is excellent and transmittance of EUV light is high in a photolithography process using the EUV light, is needed.

SUMMARY

Embodiments provide pellicles having graphite layers for an extreme ultraviolet (EUV) photolithography process.

Other embodiments provide methods of manufacturing pellicles having graphite layers for the EUV photolithography process.

In accordance with an aspect of embodiments, a method of manufacturing a pellicle includes preparing a substrate, forming a membrane on the substrate by performing a chemical vapor deposition (CVD) process, separating the membrane from the substrate in a first solvent, rinsing the separated membrane in a second solvent, and transferring the separated membrane onto a frame in a third solvent.

The substrate may include copper (Cu).

The membrane may include a graphite layer.

The first solvent may selectively include at least one of hydrogen peroxide, phosphoric acid, nitric acid, acetic acid, a cyclic amine compound, iron fluoride ($FeCl_3$), ceric ammonium nitrate (CAN), de-ionized water, and any combination thereof.

The second solvent may include de-ionized water, or a rinse solution including de-ionized water with nitric acid or hydrochloric acid.

The third solvent may include de-ionized water, alcohol, or a mixture thereof.

The third solvent may further include aminopropyltriethoxysilane (ATS) or octadecyltrichlorosilane (OTS).

The method may further include forming a straining layer on a surface of the membrane.

The straining layer may include polymethylmethacrylate (PMMA) or polydimethylsiloxane (PDMS).

The method may further include forming a capping layer on a surface of the membrane.

The capping layer may include ruthenium (Ru) or silicon nitride (SiN).

A surface of the frame may be coated with a carbon layer or a carbide layer.

In accordance with another aspect of embodiments, a method of manufacturing a pellicle includes forming a graphite layer on a substrate by performing a CVD process, forming a straining layer including polymethylmethacrylate (PMMA) or polydimethylsiloxane (PDMS) on the graphite layer, separating the graphite layer on which the straining layer is formed from the substrate, transferring the separated graphite layer onto a frame, and removing the straining layer.

The method may further include forming a capping layer between the graphite layer and the straining layer, wherein the capping layer is not removed and remains on the graphite layer.

The method may further include forming a ruthenium (Ru) layer between the substrate and the graphite layer.

In accordance with still another aspect of embodiments, a method of manufacturing a pellicle includes loading a substrate into a vacuum chamber, forming a membrane on the substrate by performing a deposition process, unloading the substrate on which the membrane is formed from the vacuum chamber, separating the membrane from the substrate by performing a separation process, rinsing the separated membrane by performing a rinsing process, and transferring the separated membrane onto a frame by performing a transfer process.

The deposition process may include a chemical vapor deposition (CVD) process using carbon (C) or source gas including a carbon compound.

The separation process may be performed in a solvent selectively including one or more among hydrogen peroxide, phosphoric acid, nitric acid, acetic acid, a cyclic amine compound, iron fluoride ($FeCl_3$), ceric ammonium nitrate (CAN), and de-ionized water.

The rinsing process may be performed in a solvent including de-ionized water or a rinse solution.

The transfer process may be performed in a solvent including de-ionized water, alcohol, or a mixture thereof.

Details of other embodiments are included in the detailed explanation and the drawings.

BRIEF DESCRIPTION OF THE DRAWINGS

The foregoing and other features and advantages will be apparent from the more particular description of preferred embodiments, as illustrated in the accompanying drawings, in which like reference numerals refer to the same parts throughout the different views. The drawings are not necessarily to scale, emphasis instead being placed upon illustrating the principles of the embodiments. In the drawings.

DETAILED DESCRIPTION

Figure 1:
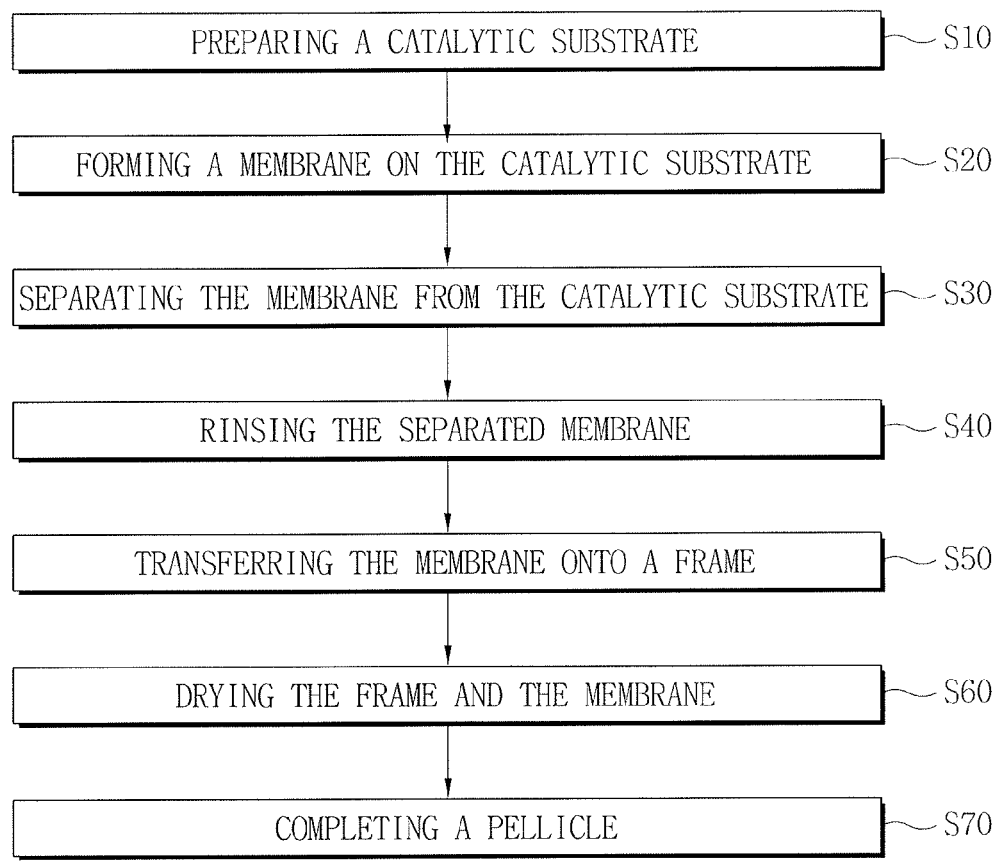
FIG. 1 illustrates a flowchart of a method of manufacturing a pellicle in accordance with an embodiment.

Various embodiments will now be described more fully with reference to the accompanying drawings in which some embodiments are shown. These embodiments may, however, be embodied in different forms and should not be construed as limited to those set forth herein. Rather, these embodiments are provided so that this disclosure is thorough and complete and fully conveys exemplary implementations to those skilled in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The exemplary embodiments will be described with reference to cross-sectional views and/or plan views, which are ideal exemplary views. Thicknesses of layers and areas may be exaggerated for effective description of the technical contents in the drawings. Forms of the embodiments may be modified by the manufacturing technology and/or tolerance. Therefore, the embodiments are not intended to be limited to illustrated specific forms, and include modifications of forms generated according to manufacturing processes. Therefore, areas illustrated in the drawings have overview properties, and shapes of the areas are not intended to be limited to the specific illustrated scope.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

FIG. 1 illustrates a flowchart for describing a method of manufacturing a pellicle in accordance with an embodiment, and FIGS. 2 through 7B illustrate views of stages in a method of manufacturing a pellicle in accordance with the embodiment.

Figure 2:
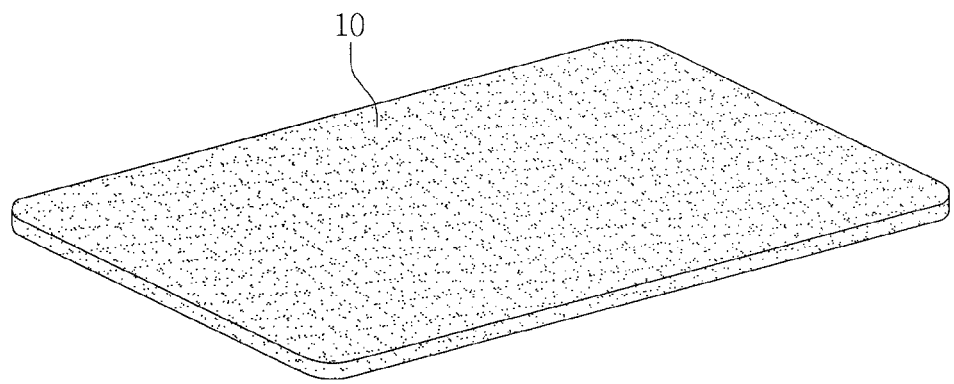
FIGS. 2 through 7B illustrate views of stages in a method of manufacturing a pellicle in accordance with an embodiment.

Referring to FIGS. 1 and 2, a method of manufacturing a pellicle in accordance with an embodiment may include preparing a catalytic substrate 10 (S10). The catalytic substrate 10 may include a metal or a metal compound. For example, the catalytic substrate 10 may include copper (Cu). In other embodiments, the catalytic substrate 10 may include at least one of chromium (Cr), nickel (Ni), ruthenium (Ru), titanium (Ti), tantalum (Ta), aluminum (Al), other metals, and alloys thereof, and metal compounds such as titanium nitride (TiN) and tantalum nitride (TaN). In another embodiment, the catalytic substrate 10 may include silicon (Si). For example, the catalytic substrate 10 may include a silicon wafer.

Figure 3A:
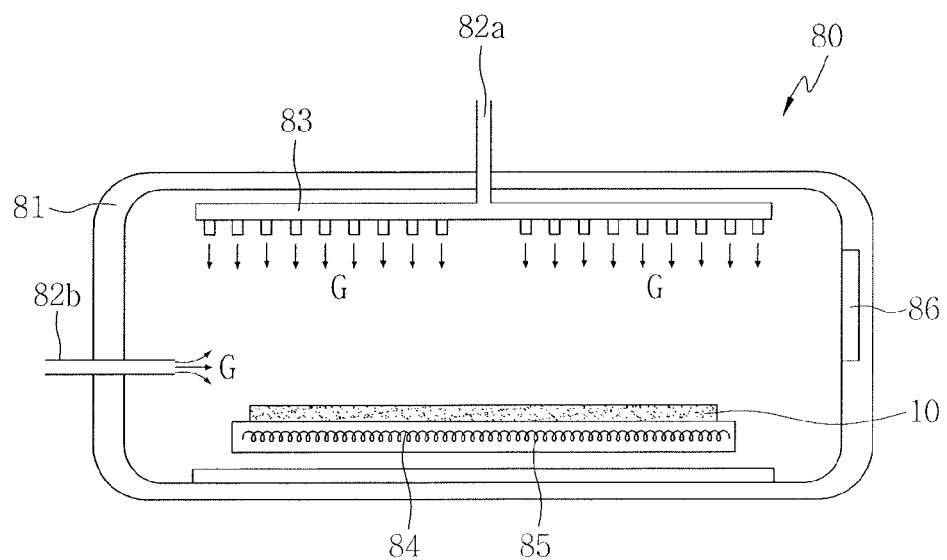
Figure 3B:
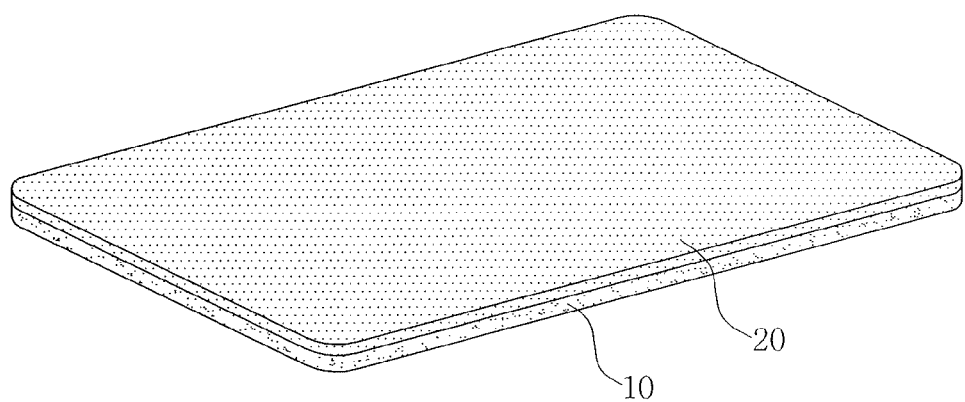

Referring to FIGS. 1, 3A and 3B, the method may include loading the catalytic substrate 10 in a vacuum chamber 81 of a deposition apparatus 80 and forming a membrane 20 on the catalytic substrate 10 by performing a deposition process such as a rapidly thermal chemical vapor deposition (RT-CVD) process, a plasma enhanced chemical vapor deposition (PE-CVD) process, a low pressure-chemical vapor deposition (LP-CVD) process, an atomic layer deposition (ALD) process, or a molecular layer deposition (MLD) process (S20). The membrane 20 may include a graphite layer.

For example, the deposition process may include injecting a source gas G containing carbon (C), such as methane ($CH_4$) or ethane ($C_2H_6$), in the vacuum chamber 81 through gas supply pipes 82a and 82b and forming the membrane 20 including the graphite layer on the catalytic substrate 10 by dissociating carbon (C) atoms. Alternatively, the source gas G may include an organic compound having a functional group containing carbon (C), such as a methyl group or an ethyl group.

The gas supply pipes 82a and 82b may be provided at an upper part or a side part of the vacuum chamber 81. When the deposition apparatus 80 includes a gas distribution plate 83, the source gas G may be uniformly supplied into the vacuum chamber 81 through the gas distribution plate 83. The carbon (C) atoms may be excited and/or dissociated using plasma energy or thermal energy.

A stage 84 disposed in the vacuum chamber 81 of the deposition apparatus 80 may include a heater 85 which heats the catalytic substrate 10. Alternatively, a lamp 86 which heats the catalytic substrate 10 may be included in a wall of the vacuum chamber 81 of the deposition apparatus 80. For example, the method may include heating the catalytic substrate 10 to a range of about 650° C. to 1100° C. while the deposition process is performed.

The membrane 20 may have a thickness in a range of several nanometers to several tens of nanometers. Physical durability is reduced as the membrane 20 is thinner, whereas a transmittance of EUV light is reduced as the membrane 20 is thicker, and thus, productivity may be reduced. For example, when the membrane 20 includes the graphite layer, the membrane 20 has a thickness of about 20 nm or less and thus the transmittance of the EUV light may become about 90% or more. When the membrane 20 includes multi-layered graphene layers, since one graphene layer has a thickness of about 0.34 nm, the membrane 20 may include the graphene layers of about 60 or less. When the membrane 20 includes ruthenium (Ru), a total thickness of the membrane 20 may be appropriately adjusted according to a thickness of the ruthenium (Ru).

When the catalytic substrate 10 includes copper (Cu), the morphology of the membrane 20 was experimentally superior to other metals.

In another embodiment, the membrane 20 may include a single graphite layer or multi-layered graphite layers, or stacked and multi-layered graphene layers. In still another embodiment, the membrane 20 may include a graphite layer coated with ruthenium (Ru) or ruthenium (Ru) coated with the graphite layer.

Figure 4:
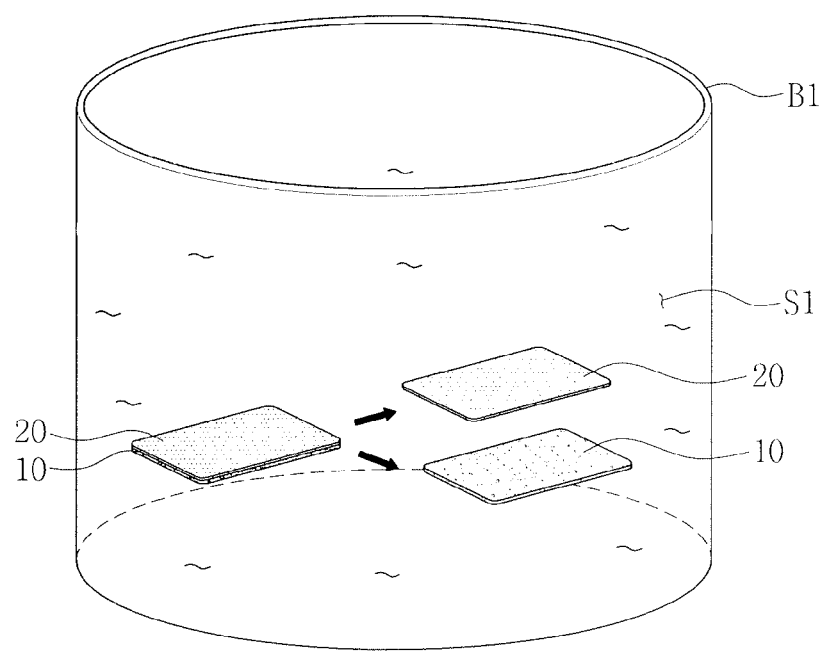

Referring to FIGS. 1 and 4. the method may include unloading the catalytic substrate 10 on which the membrane 20 is formed from the vacuum chamber 81 and separating the membrane 20 from the catalytic substrate 10 by performing a separating process (S30). The separating process may include a first wet process. The first wet process may include soaking the catalytic substrate 10 on which the membrane 20 is formed in a first bath B1 containing a first solvent S1 and separating the membrane 20 from the catalytic substrate 10. The first solvent S1 may include a metal etchant. For example, the first solvent S1 may selectively include one or more among hydrogen peroxide, phosphoric acid, nitric acid, acetic acid, a cyclic amine compound, and de-ionized water. Alternatively, the first solvent S1 may include de-ionized water with iron fluoride (FeCl3) or ceric ammonium nitrate (CAN).

Figure 5:
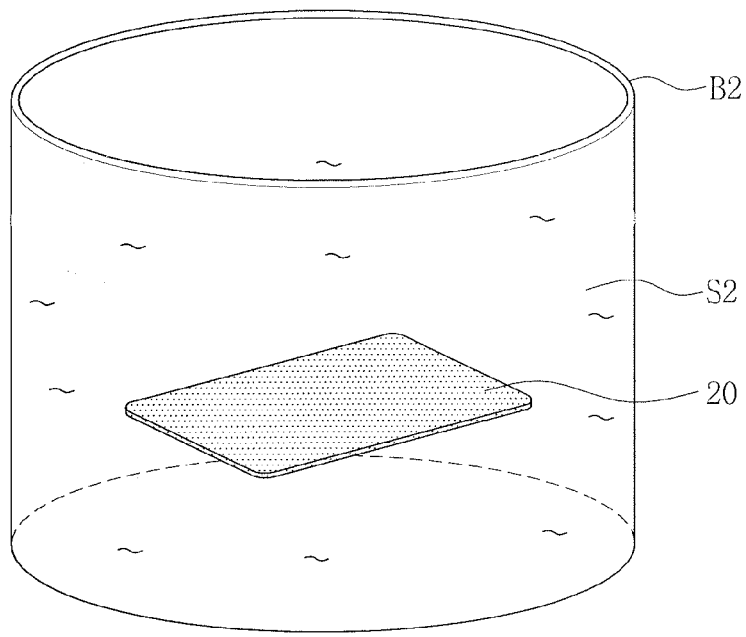

Referring to FIGS. 1 and 5, the method may include rinsing the separated membrane 20 by performing a rinsing process (S40). The rinsing process may include a second wet process. The second wet process may include soaking and rinsing the separated membrane 20 in a second bath B2 containing a second solvent S2. The second solvent S2 may include de-ionized water, or a rinse solution including de-ionized water with nitric acid or hydrochloric acid. In another embodiment, the second bath B2 may be the same as the first bath B1. For example, the method may include discharging the first solvent S1 in the first bath B1 and supplying the second solvent S2, for example, de-ionized water. or the rinse solution including nitric acid or hydrochloric acid, into the first bath B1.

Figure 6:
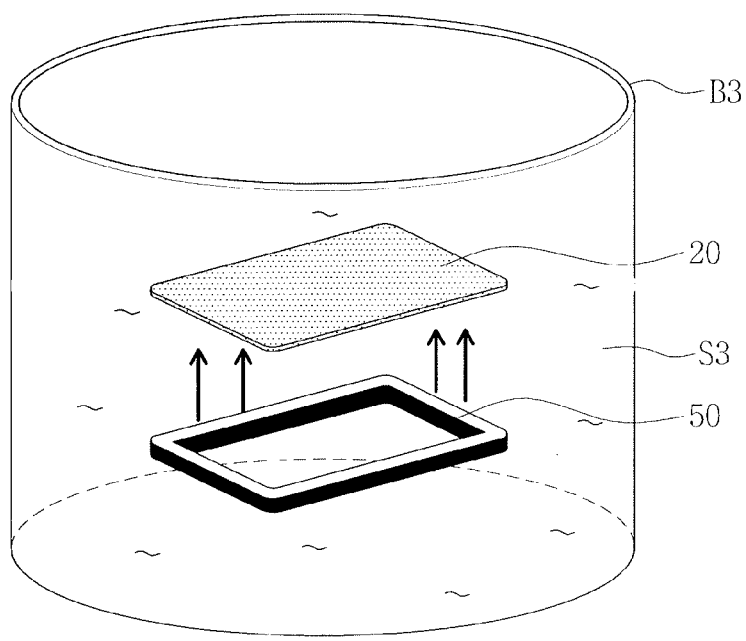

Referring to FIGS. 1 and 6, the method may include transferring the membrane 20 onto a frame 50 by performing a transfer process (S50). The transfer process may include a third wet process. The third wet process may include soaking the membrane 20 in a third bath B3 containing a third solvent S3 and adhering the membrane 20 onto the frame 50. For example, the method may include suspending the membrane 20 on the third solvent S3 and attaching the membrane 20 onto an upper part of the frame 50 by raising the frame 50 in the inside of the third solvent S3.

The third solvent S3 may include one of de-ionized water, alcohol, and a mixture thereof. The alcohol may include one of methyl alcohol, ethyl alcohol, and isopropyl alcohol. Generally, since the membrane 20 is hydrophobic, hydrophilic and hydrophobic characteristics of the third solvent S3 may be adjusted by appropriately mixing the de-ionized water and the alcohol in order to spread the membrane 20 without wrinkles. For example, since a surface tension of the de-ionized water is about 72.7 dyne/cm and a surface tension of the alcohol is about 22.4 dyne/cm at a room temperature, the de-ionized water and the alcohol may be appropriately mixed in order to obtain a surface tension at which the membrane 20 is appropriately spread.

In addition, the third solvent S3 may further include agents having a hydrophilic group or a hydrophobic group. For example, the third solvent S3 may further include hydrophilic agents such as aminopropyltriethoxysilane (ATS) or hydrophobic agents such as octadecyltrichlorosilane (OTS).

The frame 50 and the membrane 20 may be directly adhered. For example, any glue material is not interposed between the frame 50 and the membrane 20, and the frame 50 and the membrane 20 may be directly adhered by Van Der Waals force. etc.

Figure 7A:
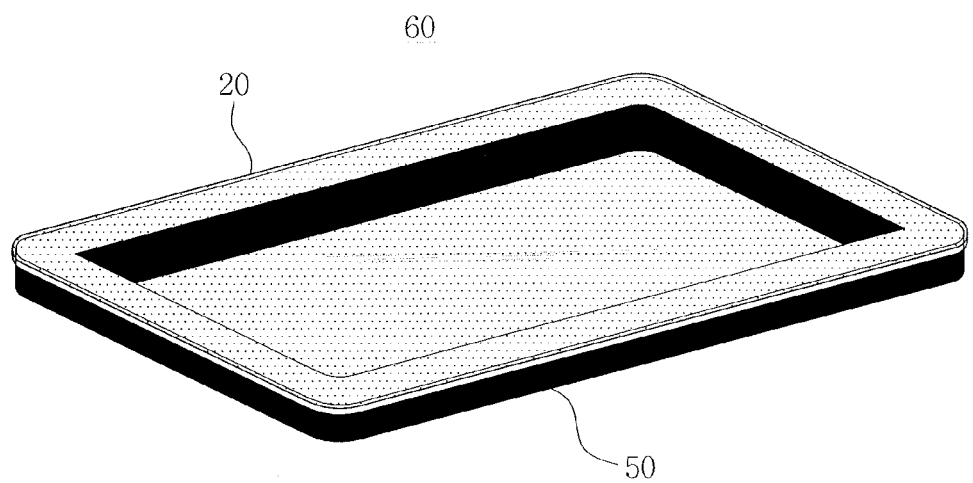
Figure 7B:
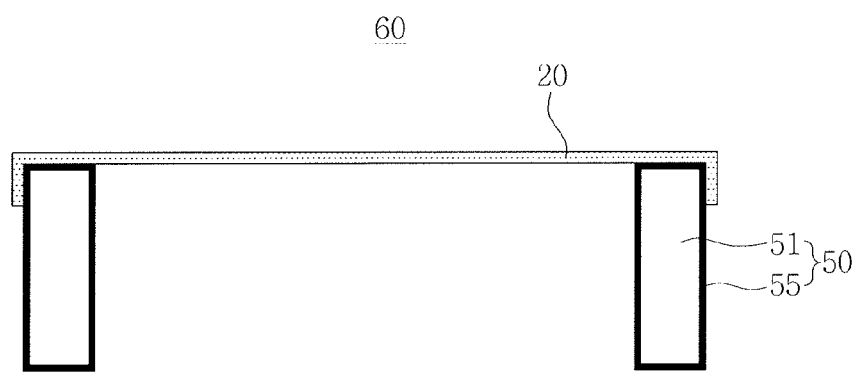

Referring to FIGS. 1, 7A, and 7B, the method may include drying the frame 50 and the membrane 20 (S60) and then completing a pellicle 60 (S70). For example, the drying process may be slowly performed in a high humidity atmosphere. Referring to FIG. 7B, the membrane 20 may extend on an outer wall of the frame 50 to cover a part of the outer wall. The frame 50 may include a body 51 and an absorption layer 55 formed on an outer surface of the body 51. The absorption layer 55 may contain a carbon layer or a carbide layer to display black color. The absorption layer 55 may absorb rather than reflect light.

Figure 8:
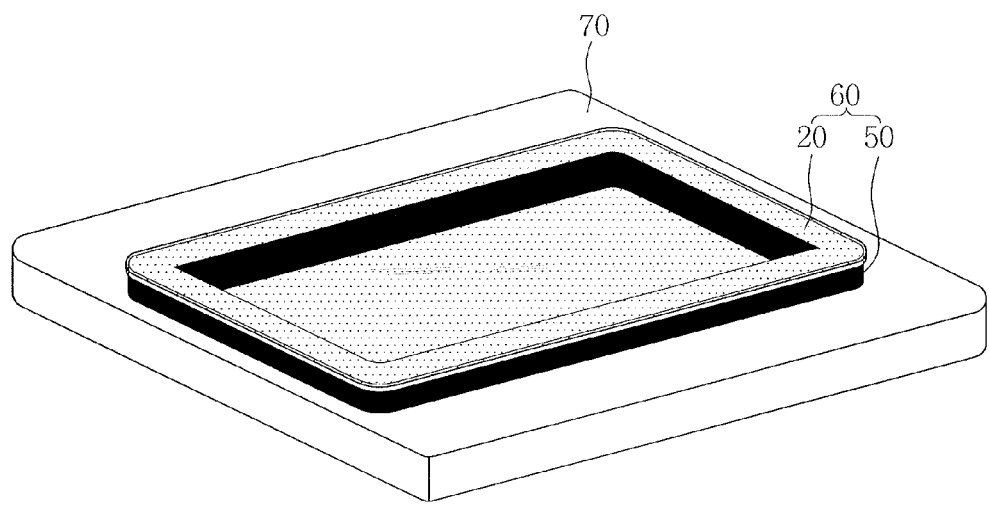
FIG. 8 illustrates a schematic view of a pellicle manufactured by the embodiment, which is attached onto a reticle.

FIG. 8 illustrates a schematic view showing a pellicle 60 manufactured by the embodiment, which is attached onto a reticle 70. Referring to FIG. 8, the pellicle 60 may be attached onto a pattern surface of the reticle 70. Since the membrane 20 of the pellicle 60 includes a graphite layer, the membrane 20 may have electrons and a repulsive force. Thus, contamination, defects, or damage caused by electrostatic particles may be prevented or reduced.

FIGS. 9 through 12B illustrate schematic views for describing methods of manufacturing pellicles in accordance with various embodiments.

Figure 9:
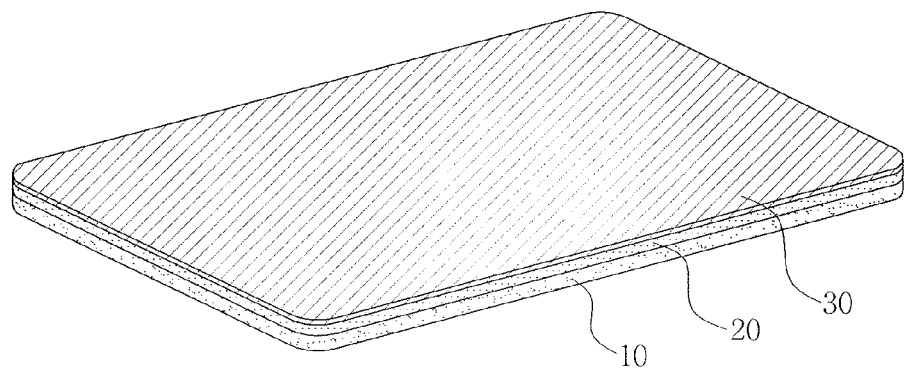
FIGS. 9 through 12B illustrate schematic views of stages in methods of manufacturing pellicles in accordance with other embodiments.

Referring to FIG. 9, a method of manufacturing a pellicle in accordance with another embodiment may include forming a membrane 20 on a catalytic substrate 10 by performing the processes described with reference to FIGS. 2, 3A, and 3B, and may further include forming a straining layer 30 on a surface of the membrane 20. The forming of the straining layer 30 may further include coating the surface of the membrane 20 with polymethylmethacrylate (PMMA) or polydimethylsiloxane (PDMS). The straining layer 30 including PMMA or PDMS can buff a surface tension occurred in a subsequent transfer process and can strain the membrane 20 to prevent and/or reduce physical damaging of the membrane 20. Further, the straining layer 30 may strain the membrane 20 in the subsequent transfer process to prevent the wrinkling phenomenon of the membrane 20.

Then, the method may include separating the membrane 20 on which the straining layer 30 is formed from the catalytic substrate 10, rinsing the straining layer 30 and the membrane 20, transferring the membrane 20 on which the straining layer 30 is formed onto the frame 50, removing the straining layer 30 by performing a wet removal process using acetone, or a dry removal process using a hydrogen plasma or an oxygen plasma, and then completing the pellicle 60 in which the membrane 20 is attached onto the frame 50, by performing the processes described with reference to FIGS. 4 through 6.

Figure 10A:
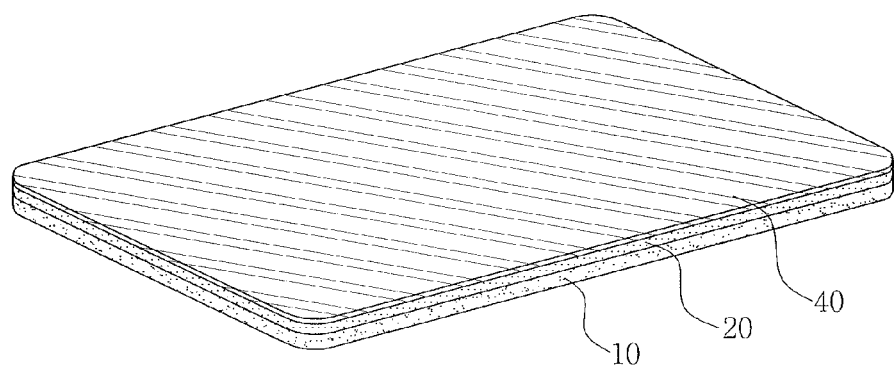

Referring to FIG. 10A, a method of manufacturing a pellicle in accordance with another embodiment may include forming a membrane 20 on a catalytic substrate 10, and forming a capping layer 40 on the membrane 20, by performing the processes described with reference to FIGS. 2, 3A, and 3B.

The capping layer 40 may be formed by performing a chemical vapor deposition (CVD) process or a physical vapor deposition (PVD) process such as a sputtering process. The capping layer 40 may include a then metal film. For example, the capping layer 40 may include a thin ruthenium (Ru) film or a thin silicon nitride (SiN) film.

In other embodiments, the capping layer 40 may be formed on both surfaces of the membrane 20. The capping layer 40 may be very thinly formed. Since the capping layer 40 may degrade a transmittance of light, the capping layer 40 may be thinly formed to have a thickness of about a several nanometers. The capping layer 40 and the membrane 20 may have a low transmittance of light. A thickness or a composition of the capping layer 40 may be adjusted so that a throughput of a photolithography process is not reduced. For example, when the capping layer 40 includes a single material such as ruthenium (Ru), the thickness of the capping layer 40 may be adjusted, and when the capping layer 40 includes a compound such as silicon nitride (SiN), a material type or a composition ratio thereof may be adjusted.

The capping layer 40 may be formed on both surfaces of the membrane 20. For example, the method of manufacturing the pellicle in accordance with yet another embodiment may include forming the capping layer 40 on the catalytic substrate 10, forming the membrane 20 on the capping layer 40, and further forming the capping layer 40 on the membrane 20.

Alternatively, the catalytic substrate 10 may include a capping material. For example, the method of manufacturing the pellicle in accordance with yet another embodiment may include forming the membrane 20 on the catalytic substrate 10 including the capping material such as ruthenium (Ru) or silicon nitride (SiN), and thinning or partially removing the catalytic substrate 10.

Alternatively, the membrane 20 may be formed on both surfaces of the capping layer 40. For example, the method of manufacturing the pellicle in accordance with yet another embodiment may include forming the membrane 20 on the catalytic substrate 10, forming the capping layer 40 on the membrane 20, and further forming the membrane 20 on the capping layer 40. In this embodiment, the catalytic substrate 10 may include silicon.

Figure 10B:
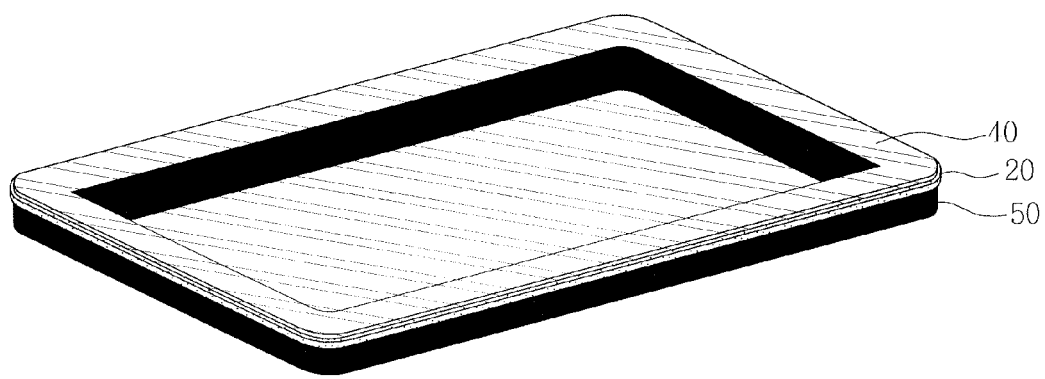

Referring to FIG. 10B, the method may include separating the membrane 20 on which the capping layer 40 is formed from the catalytic substrate 10, rinsing the capping layer 40 and the membrane 20, transferring the membrane 20 on which the capping layer 40 is formed onto the frame 50, and then completing the pellicle 65, by performing the processes described with reference to FIGS. 4 through 6. The capping layer 40 cab derive a chemical combination of amorphous carbon due to a wafer resist fumes and hydrogen radicals of atmospheric gas, which are generated during the photolithography process, to protect the membrane 20.

Figure 11:
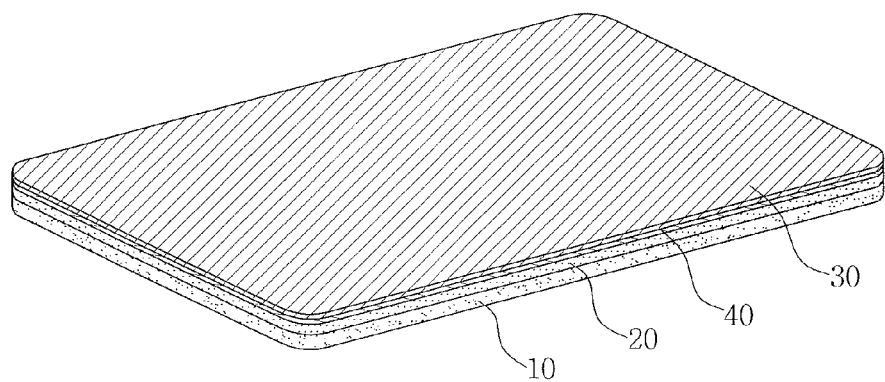

Referring to FIG. 11, a method of manufacturing a pellicle in accordance with yet another embodiment may include forming the membrane 20 on the catalytic substrate 10, forming the capping layer 40 on the membrane 20, and forming the straining layer 30 on the capping layer 40, by performing the processes described with reference to FIGS. 2, 3A, 3B, 9, and 10A.

Then, the method may include separating the membrane 20 on which the straining layer 30 and the capping layer 40 are formed from the catalytic substrate 10, rinsing the straining layer 30, the capping layer 40, and the membrane 20, transferring the membrane 20 on which the straining layer 30 and the capping layer 40 are formed onto the frame 50, removing the straining layer 30 by performing a wet removal process using acetone, or a dry removal process using a hydrogen plasma or an oxygen plasma, and then completing the pellicle 65, in which the membrane 20 on which the capping layer 40 is formed is attached onto the frame 50, by performing the processes described with reference to FIGS. 4 through 6. Then, the method may further include removing the straining layer 30.

Figure 12A:
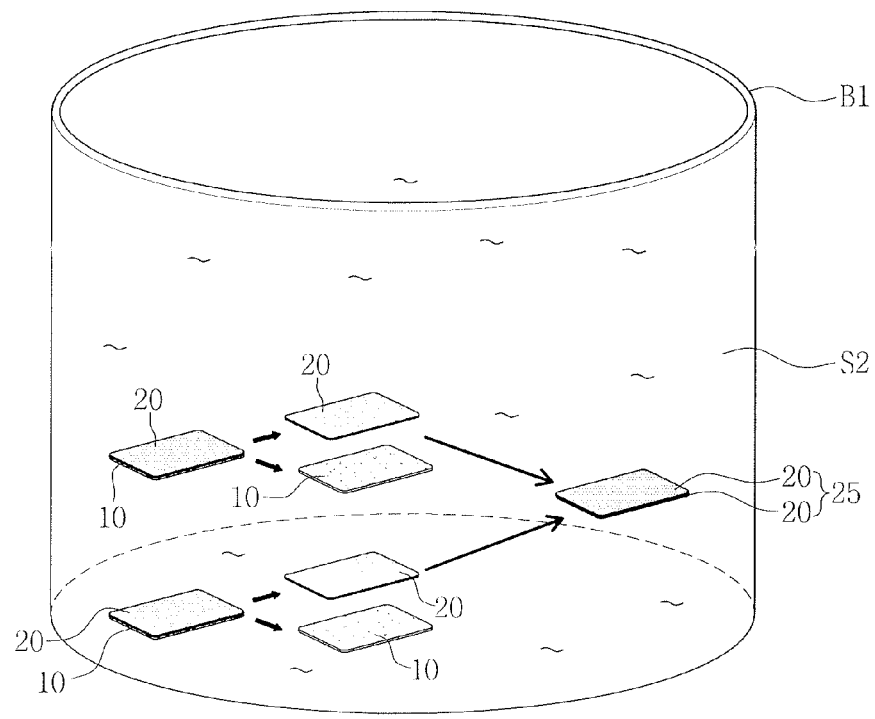

Referring to FIG. 12A, a method of manufacturing a pellicle in accordance with yet another embodiment may include overlapping and stacking the separated membranes 20 with further reference to FIG. 4. For example, the method may include stacking the membranes 20, which are separated in the first bath B1, in the second bath B2.

When it is difficult to obtain the membranes 20 of good quality having a sufficient thickness in the deposition process, the membranes 20 of good quality may overlap with each other and then the membrane 20 having the appropriate thickness may be finally obtained. For example, in the deposition process, when the membrane 20 is formed to have a thickness of about 10 nm, and when the membrane 20 is formed to have the highest quality or the process is stably performed, the membrane 20 which is formed to have a thickness of 10 nm may overlap and may be stacked. Alternatively, the membranes 20 which are formed to have a predetermined thickness overlap with each other to form a stacked membrane 25 having various thicknesses.

Experimentally, the stacked membrane 25 has had a more excellent crystallized morphology than the single-layer membrane 20. While the single-layer membrane 20 may include a fine pin-hole, it is because the pin-hole may be compensated for in the stacked membrane 25.

Figure 12B:
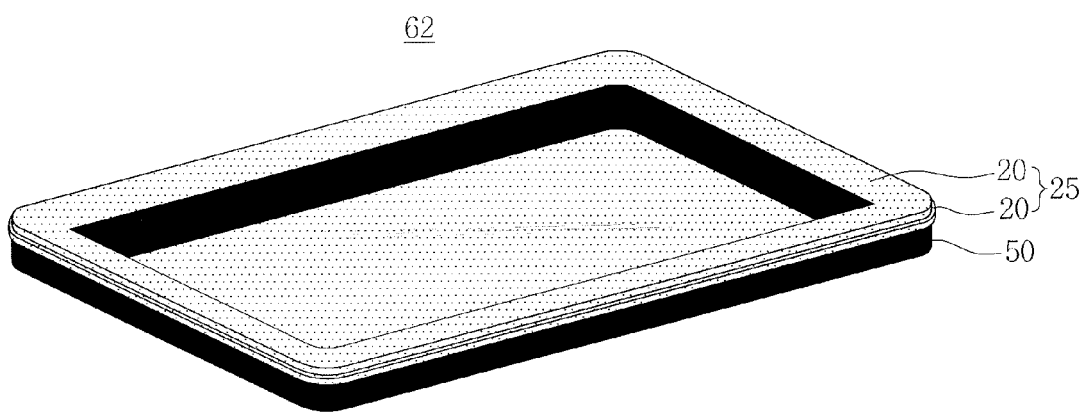

Referring to FIG. 12B, the method may include performing the processes described with reference to FIGS. 5 and 6 and then completing a pellicle 62 including the stacked membrane 25 by performing a dry process.

Figure 13:
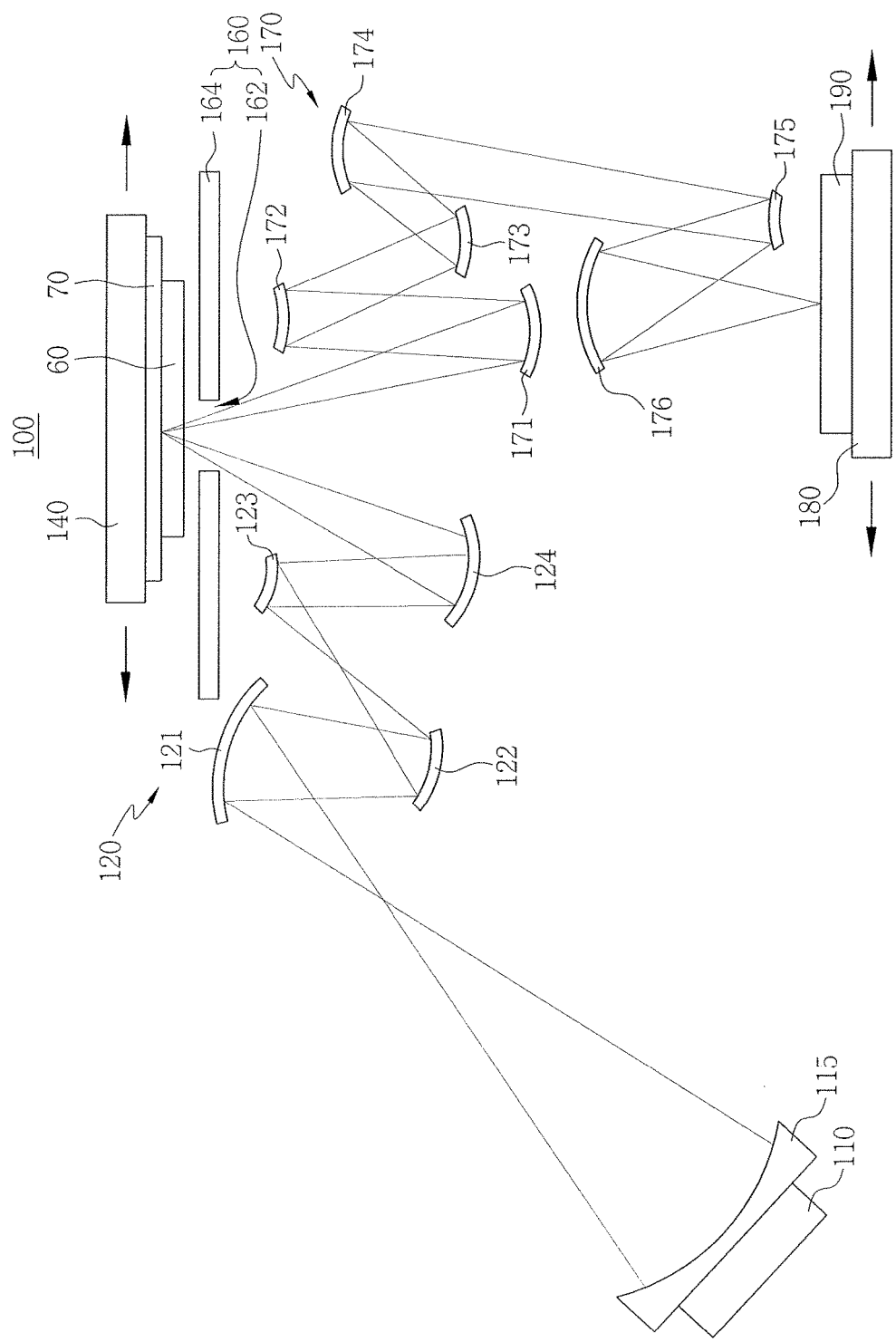
FIG. 13 illustrates a conceptual view of a reflective photolithography process using a reticle onto which a pellicle in accordance with an embodiment is attached.

FIG. 13 illustrates a conceptual view showing performing of a reflective photolithography process using the reticle 70 onto which the pellicle 60 in accordance with the embodiment is attached.

Referring to FIG. 13, a method of performing a reflective photolithography process using a reticle 17 having a pellicle 60 according to embodiments includes providing a photolithography system having a light source 110, an illumination mirror system 120, a reticle stage 140, a blinder 160, a projection mirror system 170, and wafer stage 180, and installing the reticle 70 facing downwardly on the reticle stage 140.

The light source 110 may generate EUV light. For example, the light source 110 may generate light having a wavelength of about 13.5 nm, for example, the EUV light, using a carbon plasma. The light source 110 may include a light collector 115. The light collector 115 may adjust collected EUV light to propagate linearly in any one direction after collecting the EUV light generated from the light source 110. For example, the EUV light generated from the light source 110 may be irradiated to the illumination mirror system 120 through the light collector 115.

The illumination mirror system 120 may include a plurality of illumination mirrors 121 to 124. For example, the illumination mirrors 121 to 124 may condense the EUV light in order to reduce loss of the EUV light which propagates out of the mirrored irradiating paths. Further, for example, the illumination mirrors 121 to 124 may uniformly adjust an overall intensity distribution of the EUV light. Therefore, each of the plurality of illumination mirrors 121 to 124 may include a concave mirror and/or a convex minor in order to diversify the path of the EUV light. Further. the illumination mirror system 120 may form the EUV light to a square shape, a circular shape, a bar shape, or the like to transfer the formed EUV light to the reticle stage 140.

The reticle stage 140 may mount the reticle 70 on a lower surface thereof and may move in a horizontal direction. For example, the reticle stage 140 may move in directions of the arrows in the drawing. The reticle stage 140 may include an electrostatic chuck (ESC). The reticle 70 may include optical patterns on one surface. The reticle 70 may be mounted on the lower surface of the reticle stage 140 so that the surface on which the optical patterns are formed faces downward in the drawing.

The blinder 160 may be disposed under the reticle stage 140. The blinder 160 may include a slit 162 and a plate 164. The slit 162 may have an aperture shape. The slit 162 may form a shape of the EUV light transferred from the illumination mirror system 120 to the reticle 70 mounted on the reticle stage 140. The EUV light transferred from the illumination mirror system 120 may be irradiated to the reticle 70 mounted on the reticle stage 140 through the slit 162. The EUV light reflected from the reticle 70 mounted on the reticle stage 140 may be transferred to the projection mirror system 170 through the slit 162. The plate 164 may block the EUV light irradiated into a region other than the slit 162. Therefore, the blinder 160 may pass some of the EUV light through the slit 162 and block some of the EUV light using the plate 164. Further, the EUV light reflected from the reticle 70 mounted on the lower surface of the reticle stage 140 may pass through the slit 162.

The projection mirror system 170 may receive the EUV light, which is reflected from the reticle 70 and passed through the slit 162. and then may transfer the received EUV light to a wafer 190. The projection mirror system 170 may also include a plurality of projection mirrors 171 to 176. The EUV light which is irradiated onto the wafer 190 by the projection mirrors 171 to 176 may include hypothetical aerial image information of the optical patterns of the reticle 70. The EUV light irradiated onto the wafer 190 may have a shape which is formed by the slit 162. The plurality of projection mirrors 171 to 176 may correct various aberrations.

The wafer stage 180 may seat the wafer 190 and move in a horizontal direction. For example, the wafer stage 180 may move in directions of the arrows in the drawing. The wafer stage 180 may simultaneously move in the same direction as the reticle stage 140 at a predetermined ratio. For example, in the case in which a movement ratio is 10:1 (10%), when the reticle stage 140 moves 10 µm to the left or right, the wafer stage 180 may move 1 µm in the same direction. In the case in which the movement ratio is 5:1 (20%), when the reticle stage 140 moves 10 µm to the left or right by, the wafer stage 180 may move 2 µm in the same direction. The movement ratio may be variously set. For example, the wafer stage 180 may move in a step and scan method. A focus of the EUV light irradiated from the projection mirror system 170 may be located above/on a surface of the wafer 190. For example, a photoresist layer may be formed to have a predetermined thickness on the wafer 190, and the focus of the EUV light may be located in the photoresist layer.

In the drawing, paths in which the EUV light is propagated are conceptually shown in order to easily understand embodiments.

The membrane of the pellicle for an extreme ultraviolet (EUV) photolithography process according to various embodiments has excellent tolerance to particle contamination, high durability due to good resistance to physical damage, and a sufficient transmittance of EUV light. Therefore, since the EUV photolithography process can be stably performed, productivity is improved and a unit price is reduced.

Since the graphite layer of the pellicle according to the various embodiments has good physical durability, good durability for the EUV light, and excellent tolerance to dissociated gas and hume, a lifetime of the pellicle and a reticle are increased. Further, since the graphite layer of the pellicle according to the various embodiments has a repulsive force with respect to an electrostatic particle, the photolithography process can be stably performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a pellicle, the method comprising:
   preparing a substrate;
   forming a membrane on the substrate by performing a chemical vapor deposition (CVD) process;
   separating the membrane from the substrate in a first solvent;
   rinsing the separated membrane in a second solvent; and
   transferring the separated membrane onto a frame in a third solvent.

2. The method as claimed in claim 1, wherein the substrate comprises copper (Cu).

3. The method as claimed in claim 1, wherein the membrane comprises a graphite layer.

4. The method as claimed in claim 1, wherein the first solvent selectively comprises at least one of hydrogen peroxide, phosphoric acid, nitric acid, acetic acid, a cyclic amine compound, iron fluoride ($FeCl_3$), eerie ammonium nitrate (CAN), de-ionized water, and any combination thereof.

5. The method as claimed in claim 1, wherein the second solvent comprises de-ionized water, or a rinse solution including de-ionized water with nitric acid or hydrochloric acid.

6. The method as claimed in claim 1, wherein the third solvent comprises de-ionized water, alcohol, or a mixture thereof.

7. The method as claimed in claim 6, wherein the third solvent further comprises aminopropyltriethoxysilane (ATS) or octadecyltrichlorosilane (OTS).

8. The method as claimed in claim 1, further comprising forming a straining layer on a surface of the membrane.

9. The method as claimed in claim 8, wherein the straining layer comprises polymethylmethacrylate (PMMA) or polydimethylsiloxane (PDMS).

10. The method as claimed in claim 1, further comprising forming a capping layer on a surface of the membrane.

11. The method as claimed in claim 10, wherein the capping layer comprises ruthenium (Ru) or silicon nitride (SiN).

12. The method as claimed in claim 1, wherein a surface of the frame is coated with a carbon layer or a carbide layer.

13. A method of manufacturing a pellicle, the method comprising:
   forming a graphite layer on a substrate by performing a chemical vapor deposition (CVD) process;
   forming a straining layer including polymethylmethacrylate (PMMA) or polydimethylsiloxane (PDMS) on the graphite layer;
   separating the graphite layer on which the straining layer is formed from the substrate;
   transferring the separated graphite layer onto a frame; and
   removing the straining layer.

14. The method as claimed in claim 13, further comprising forming a capping layer between the graphite layer and the straining layer,
   wherein the capping layer is not removed and remains on the graphite layer.

15. The method as claimed in claim 13, further comprising forming a ruthenium (Ru) layer between the substrate and the graphite layer.

16. A method of manufacturing a pellicle, the method comprising:
   loading a substrate into a vacuum chamber;
   forming a membrane on the substrate by performing a deposition process;
   unloading the substrate on which the membrane is formed from the vacuum chamber;
   separating the membrane from the substrate by performing a separation process;
   rinsing the separated membrane by performing a rinsing process; and
   transferring the separated membrane onto a frame by performing a transfer process.

17. The method as claimed in claim 16, wherein the deposition process comprises a chemical vapor deposition (CVD) process using carbon (C) or source gas including a carbon compound.

18. The method as claimed in claim 16, wherein the separation process is performed in a solvent selectively including one or more among hydrogen peroxide, phosphoric acid, nitric acid, acetic acid, a cyclic amine compound, iron fluoride ($FeCl_3$), eerie ammonium nitrate (CAN), and de-ionized water.

19. The method as claimed in claim 16, wherein the rinsing process is performed in a solvent including de-ionized water or a rinse solution.

20. The method as claimed in claim 16, wherein the transfer process is performed in a solvent including de-ionized water, alcohol, or a mixture thereof.

* * * * *